(12) United States Patent
Singh et al.

(10) Patent No.: US 12,388,530 B1
(45) Date of Patent: *Aug. 12, 2025

(54) SWITCHED BLEED CURRENTS

(71) Applicant: ACACIA TECHNOLOGY, INC., San Jose, CA (US)

(72) Inventors: Ramesh K. Singh, Newark, CA (US); Ian Dedic, London (GB); Gavin Allen, Greenwood (AU)

( * ) Notice: Subject to any disclaimer, the term of this patent is extended or adjusted under 35 U.S.C. 154(b) by 0 days.

This patent is subject to a terminal disclaimer.

(21) Appl. No.: 18/629,375

(22) Filed: Apr. 8, 2024

Related U.S. Application Data

(63) Continuation of application No. 17/179,527, filed on Feb. 19, 2021, now Pat. No. 11,956,019.

(60) Provisional application No. 62/979,166, filed on Feb. 20, 2020.

(51) Int. Cl.
*H04B 10/04* (2006.01)
*H04B 10/50* (2013.01)
*H04B 10/508* (2013.01)
*H04B 10/516* (2013.01)

(52) U.S. Cl.
CPC ......... *H04B 10/501* (2013.01); *H04B 10/508* (2013.01); *H04B 10/516* (2013.01)

(58) Field of Classification Search
CPC .. H04B 10/501; H04B 10/508; H04B 10/516; H04B 10/505; H04B 10/5561; H04B 10/40; H04B 10/2507; H04B 10/69; H04B 10/616; H03M 1/66; H03M 1/12; H03M 1/1255; H03M 1/0624; H03M 1/1009; H03M 1/1245
USPC ....... 398/182, 183, 188, 194, 202, 208, 209, 398/135, 136, 158, 159, 189, 200, 154, 398/155, 79; 341/110, 141, 144, 155; 327/407, 408, 411, 415, 416, 417
See application file for complete search history.

(56) References Cited

U.S. PATENT DOCUMENTS

| | | | |
|---|---|---|---|
| 8,976,050 B1 * | 3/2015 | Dedic | H03M 1/0624 341/110 |
| 11,599,140 B1 | 3/2023 | Dedic et al. | |
| 11,956,019 B1 * | 4/2024 | Singh | H04B 10/501 |
| 2019/0229742 A1 * | 7/2019 | Koenenkamp | H03M 1/0624 |

* cited by examiner

*Primary Examiner* — Hanh Phan
(74) *Attorney, Agent, or Firm* — Patterson + Sheridan, LLP

(57) ABSTRACT

A method, system, and apparatus for multiplexing comprising feeding a signal into a sampler, splitting a first signal into an even branch at a first set of times, splitting a second signal into an odd branch at a second set of times, feeding a switch bleed current into the first branch at the second set of time and feeding the switch bleed current into the second branch at the first set of time.

20 Claims, 17 Drawing Sheets

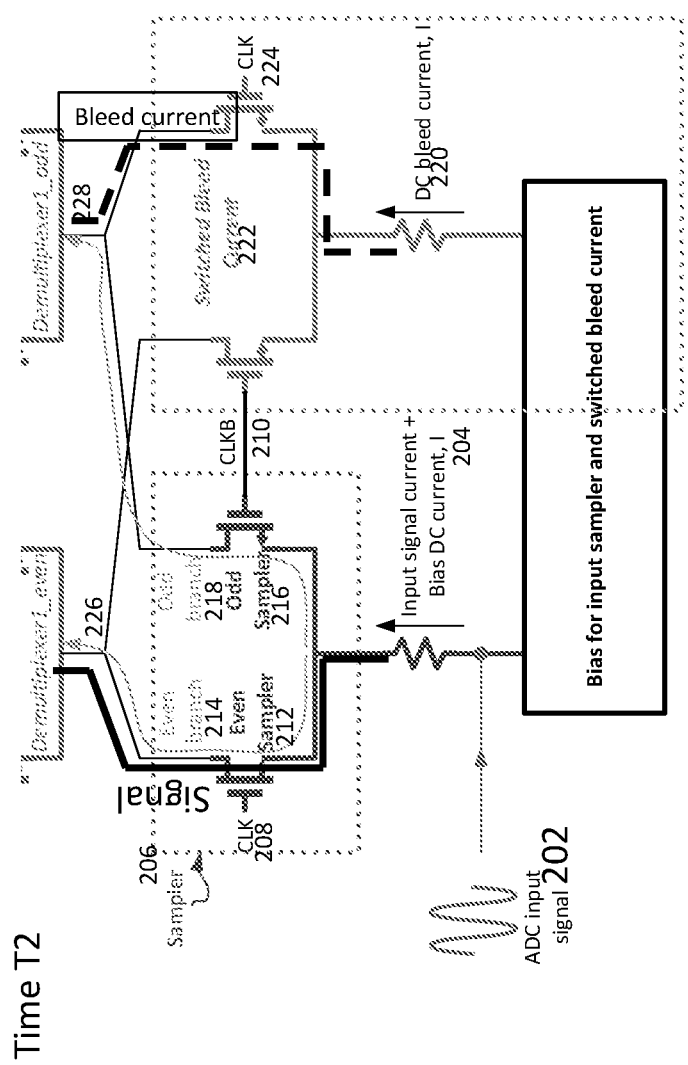

SWITCHED BLEED CURRENTS

CLAIM OF PRIORITY AND CROSS-REFERENCE TO RELATED APPLICATIONS

This application claims the benefit of and priority under 35 U.S.C. § 120 to U.S. patent application Ser. No. 17/179,527 filed Feb. 19, 2021, entitled "SWITCHED BLEED CURRENTS," which claims the benefit of U.S. Provisional Patent Application Ser. No. 62/979,166 filed Feb. 20, 2020 entitled "SWITCHED BLEED CURRENTS," the entire disclosures of which are hereby incorporated by reference herein.

This application is related to U.S. patent application Ser. No. 17/179,528 filed Feb. 19, 2021 entitled "Switched Bleed Currents," U.S. Provisional Patent Application Ser. No. 62/950,612 filed Dec. 19, 2019 entitled "High-Q Clock Buffer," U.S. Provisional Patent Application Ser. No. 62/879,095 filed Jul. 26, 2019 entitled "Switch," U.S. patent application Ser. No. 16/564,044 filed Sep. 9, 2019 entitled "High-Q Switch Inductor," U.S. patent application Ser. No. 16/587,191 filed Sep. 30, 2019 entitled "Distributed Voltage Controlled Oscillator (VCO)," now U.S. Pat. No. 11,599,140, and U.S. patent application Ser. No. 16/685,063 filed Nov. 15, 2019 entitled "Clock Buffer Inductor," all of which are hereby incorporated herein by reference in their entirety for all purposes.

BACKGROUND

Optical transmission of information over a fiber optic cable often encodes the information on a light wave.

SUMMARY

A method, system, and apparatus for multiplexing comprising feeding a signal into a sampler, splitting a first signal into an even branch at a first set of times, splitting a second signal into an odd branch at a second set of times, feeding a switch bleed current into the first branch at the second set of time and feeding the switch bleed current into the second branch at the first set of time.

BRIEF DESCRIPTION OF THE DRAWINGS

Various aspects and embodiments of the application will be described with reference to the following example embodiments. It should be appreciated that the figures are not necessarily drawn to scale.

FIGS. 2A-2E are simplified illustrations of switching or sampling of an input signal, in accordance with embodiments of the present disclosure;

DETAILED DESCRIPTION

Figure 1:
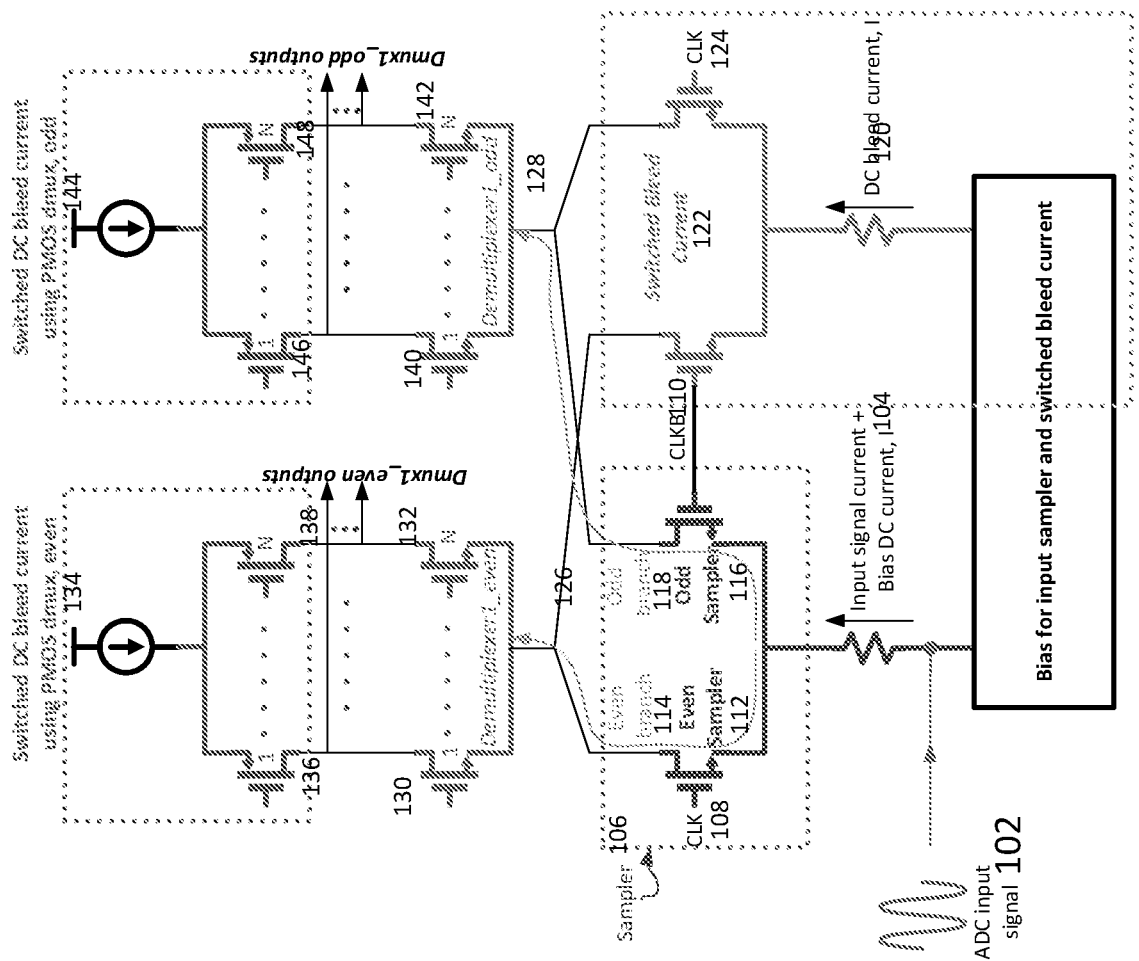
FIG. 1 is a simplified illustration of a front-end circuit for a demultiplexer and demultiplexer with n paths, in accordance with an embodiment of the present disclosure.

In many embodiments, a communication or transmission system may include a transmitter and a receiver. In some embodiments, a communication system may include two transceivers. In most embodiments, a transmission, such as a set of bits, may be encoded in a signal at a transmitter. In some embodiments, a transmitter may transmit an encoded signal to a receiver. In certain embodiments, a receiver may receive a signal from a transmitter and decode the signal into information. In almost all embodiments, there may be a number of conditions that may impact the signal which may make it hard to decode the information. In certain embodiments, a signal may be transmitted over an RF connection. In other embodiments, a signal may be transmitted over an optical link.

In some embodiments, in a coherent optical system, a digital electrical signal may be received. In certain embodiments, a digital electrical signal may be converted to an analog signal. In many embodiments, an analog signal may be converted to an optical signal. In almost all embodiments, a received optical signal may need to be converted to an analog signal, which may need to be converted to an electrical signal or digital signal.

In most embodiments, a coherent optical communication system may have high data rates. In almost all embodiments, it may be necessary to divide data received into discrete time intervals. In many embodiments, a clock on a transmitter may determine when portions of a signal are sent out. In some embodiments, an analog to digital converter may determine when samples are taken and converted into a digital format. In many embodiments, in a coherent optical system, it may be necessary to do a conversion between a digital signal and an analog signal at many gigabaud per second. In most embodiments, in a coherent optical signal, it may be necessary to convert an optical signal to an analog signal at many gigabaud per second. In some embodiments, in a coherent optical system, it may be necessary to convert an analog signal to an electrical signal at many gigabaud per second.

In most embodiments in a coherent optical system, a conversion between digital to analog, analog to optical, optical to analog, and analog to digital may need to run at speeds of 50-60 gigabaud or faster per second. In many embodiments, accuracy of a conversion may need to be high and signal to noise distortion of the signal may need to be low. In almost all embodiments, accurate conversion of a signal may require an accurate clock at both a transmission site and at a receive site. In most embodiments, a clock may need to run at a high speed and have very high slew rates. In certain embodiments, slew rate may be 2n times the frequency of the clock. In many embodiments, if a clock moves in time, such as jittering backward or forward in time, this may introduce a time error into a communication system which may then introduce a voltage error which may degrade the accuracy of a communication. In some embodiments herein, jitter may refer to phase noise (i.e., random, undesired fluctuations) in the wave produced by a voltage-controlled oscillator (VCO).

In many embodiments, there may be 20 picoseconds between transmitted or received data samples. In certain embodiments, a clock may be used to denote the time between samples. In some embodiments, a same amount of jitter may create bigger voltage errors at higher frequencies. In most embodiments, a clock may need to be distributed to each circuit or device that uses the clock. In many embodiments, a distribution of a clock may need to cover a big area. In certain embodiments, distributing a clock of a VCO across a distance may take power. In almost all embodiments, it may be beneficial to be able to generate and distribute a clock signal without dissipating power and keeping jitter to a minimum.

In many embodiments, it may also be necessary to demultiplex a received signal in pieces of a signal to enable demuxed signals to be converted from analog signals to digital signals in parallel. In certain embodiments a signal may be so information rich that it may be necessary to split the signal into parts and parallel process the information to efficiently recover the information in the signal. In most embodiments, it may be beneficial to have a low-power high-performance front-end for a high-speed (tens of gigasamples) analog to digital converter.

In almost all embodiments, it may be beneficial to be able to demultiplex a sampled signal to drive an array of lower-speed interleaved ADCs. In most embodiments, it may not be possible to convert a signal with tens of gigasamples at once and it may be necessary to split a signal sample into multiple parallel number of samples. In certain embodiments, a received analog signal may be expressed as one or more currents or current packets as a carrier for the signal. In many embodiments, it may be necessary to have a distributed clock for a Digital to Analog Converter (DAC). In most embodiments, each portion of a demuxed signal may need to have a clock associated with it.

In many embodiments, it may also be necessary to demultiplex a received signal to enable demuxed signals to be converted from analog signals to digital signals in parallel. In most embodiments, it may be beneficial to have a low-power high-performance front-end for a high-speed (tens of gigasamples) analog to digital converter. In almost all embodiments, it may be beneficial to be able to demultiplex a sampled signal to drive an array of lower-speed interleaved ADCs. In most embodiments, it may not be possible to convert a signal with tens of gigasamples at once and it may be necessary to split a signal sample into multiple parallel number of samples. In certain embodiments, a received analog signal may be expressed as one or more currents or current packets as a carrier for the signal.

In certain embodiments, the current disclosure may enable a method, architecture, and associated circuitry to implement low-power high-performance front-end for a high-speed (tens of gigasamples) ADC, and may enable demultiplexing a sampled signal to drive an array of lower-speed interleaved sub-ADCs. In some embodiments, the current disclosure realizes that demuxing, through a series of cascaded steps, an input signal into a series of charges to a number of different charge packets or pulses may be problematic due resistance and having to drive each of the charge packets. In certain embodiments with charge packets, sections of a demultiplexer that have a the current steered away from them may take a long time to settle. In many embodiments, taking a long time to settle may lead to intersymbol interference (ISi) between samples. In some embodiments, a signal path in a circuit may have a memory that may need to clear before another signal is transmitted. In many embodiments, a steered current may take a long time to settle in a circuit. In certain embodiments, a charge may take a certain amount of time, or a period, to go through a circuit. In most embodiments, in a high speed switch or demultiplexer it may not be possible to transfer all the charge in a given amount of time. In many embodiments, part of a charge may remain on an input side of a switch in a given period and may interfere with a next charge or signal being transferred on the switch.

In almost all embodiments, part of a charge remaining from a previous cycle or transmission may cause ISI between the transmitted charges. In many embodiments, ISI may cause a ripple on a non-linearity plot, which may be referred to as noise. In some embodiments, ISI may cause periodic ripples in a frequency response of an ADC output which may be difficult to remove. In additional embodiments, ISI may exhibit a periodic ripple on the non-linearity plot with input signal frequency and also may cause higher non-linearity at certain input signal frequencies.

In some embodiments, eliminating or reducing ISI may have been achieved using resistive switches between two sides of a differential circuit to reset the different sides to a same voltage, but this may be problematic as providing high-speed large-swing clocks for these switches which are aligned to the sampling clocks may difficult, and large common-mode voltage changes may remain in a multiplexer. In some embodiments, resetting differential sides of a circuit may result in a loss of a part of a signal thereby reducing internal signal swings and degrading ADC's noise performance. In certain embodiments, with demultiplexing a charge, at output of a demultiplexer where charge pulses are converted back to voltage there may be a large common-mode current, which may cause large voltage swings which reduce circuit headroom.

In some embodiments, the current disclosure may use a first set of switched "bleed" currents (DC with no signal content) to keep a multiplexer current more constant and use a second set of DC bleed currents to cancel out the common-mode currents. In certain embodiments, using a first set of bleed currents and a second set of bleed currents may result in higher performance and lower supply voltage and power consumption.

In some embodiments, a demultiplexing circuit may consist of N paths for each of an even and odd branch of sampler outputs. In many embodiments, a two stage input sampler may steer an input current signal and an added DC current I to two branches of a multiplexer. In some embodiments, an input signal may be steered to an even branch A when CLK is high (active) and to an odd branch B when CLKB is high. In certain embodiments, a pair of switches with outputs in parallel to a sampler may steer a DC "dummy bleed current" in the opposite clock phase or in the opposite direction. In many embodiments, when a clock signal is not being delivered to a branch, such as when the clock signal is being delivered to another branch, a dummy current may be delivered to the branch without the clock signal.

In other embodiments, a sampler may be a 2, 3, or 4-way sampler. In almost all embodiments, a sampler may direct a sample to a demultiplexer based on time. In certain embodiments, for example with a 4 way sampler, a bleed current may be directed for either 2, 3, or 4 cycles. In almost all embodiments, a bleed current will be switched off before a new signal is directed from the sampler. In some embodiments, a bleed current may be on a ground side. In other embodiments, a bleed current may be on a supply side. In certain embodiments, for supply side devices, N type devices may be preferred. In some embodiments, devices may be operated in 2 regions. In certain embodiments in a first region, saturation may act as an amplifying device. In another region, a triode may act as a switch.

In some embodiments, an input current into each multiplexer may have a same DC current on both the clock phases, with a signal superimposed on one phase. In certain embodiments, if a DC current is a same value on both clock phases, a multiplexer may have fast settling on both phases instead of only one, which may remove intersymbol interference and the need for resistive switches with different clocks. In many embodiments, a dummy bleed current circuit may not need to be a same size as sampler switches and resistor and may be scaled down for smaller power dissipation at a cost of lower ISI reduction.

In certain embodiments, an ADC input signal may be inputted to a sampler. In many embodiments, a sampler may sample or switch out based on even and odd samples. In most embodiments, an even sampler may be sent to an even demultiplexer and an odd sampler may be sent to an odd demultiplexer. In almost all embodiments, the sampler may switch between sending an even sample and an odd sample based on a clock signal.

In most embodiments, there may be many input DC bleed currents to a switched bleed current. In certain embodiments, a switched bleed current may output a bleed current to either an even demultiplexer or an odd demultiplexer. In many embodiments, a switched bleed current may switch between two outputs based on a clock signal. In some embodiments, a sampler and a switched bleed current may be connected to an even demultiplexer and an odd demultiplexer such that when the sampler is connected to an even demultiplexer, the switched bleed current may be connected to the odd demultiplexer. In many embodiments, a sampler and a switched bleed current may be connected to an even demultiplexer and an odd demultiplexer such that when the sampler is connected to an odd demultiplexer the switched bleed current may be connected to the even demultiplexer. In many embodiments, where a clock and clock bar signal is used, the clock and clock bar may represent the same clock, in and out of phase.

In many embodiments, input currents, such as a sampler current or a dummy switched bleed current, may be sent into multiplexers which have a same DC current on both the clock phases, where on a first clock phase a sampler input is connected and on a second phase a dummy switched bleed current is connected, with the signal superimposed on one phase. In most embodiments, alternating between a sampler input and a switched bleed current on different clock cycles may result in a multiplexer having a fast settling on both phases instead of only one, removing intersymbol interference and the need for resistive switches with different clocks. In certain embodiments, a dummy bleed current circuit may not be a same size as sampler switches and resistors and may be scaled down for smaller power dissipation at the cost of lower ISI reduction.

In almost all embodiments, a transistor may need a minimum amount of voltage to function correctly, which may be referred to as headroom. In many embodiments, if a transistor doesn't have enough headroom or the minimum charge, then the transistor may not function correctly. In many embodiments, 100 m Watts may be the minimum amount of voltage a transistor needs to function. In most embodiments, different parts of a circuit may absorb or use voltage leaving less voltage for other parts of the circuit.

In some embodiments, when current pulses emerge from time-interleaved outputs of a demultiplexer, such as an even demultiplexer and an odd demultiplexer where only one of the even/odd demultiplexers is active at once, the output has a DC content (for example, I) with a signal superimposed (for example, +/−I/2). In many embodiments, to reduce or remove a DC content of a signal, an opposite polarity DC bleed current (for example, −1) may be steered through another demultiplexer to the active output. In most embodiments, steering an opposite polarity DC bleed current may reduce required signal swing and may also help settling requirements of circuits, to allow a lower supply voltage or lower overall power consumption or a combination of the two. In many embodiments, an opposite polarity bleed current may be realized using PMOS demultiplexing switches and current source from a supply. In some embodiments, a current source may be realized using active devices or a resistor connected to supply. In many embodiments, a PMOS may be a type of a MOS or MOSFET or MOS transistor. In some embodiments a MOS may be an NMOS. In certain embodiments, an NMOS transistor may be made using N doping. In other embodiments, a PMOS transistor may be made using p doping.

Refer now to the example embodiment of FIG. 1, which illustrates a front-end circuit for a demultiplexer and demultiplexer with n paths. For simplicity, in FIG. 1, only a single-ended circuit is shown. In certain embodiments, differential implementation may be used for better noise performance by using two instances of the circuit shown in FIG. 1 for 0° and 180° phase shifted input signals. In other embodiments, a sampler divides an input to more than two outputs.

Referring back to the example embodiment of FIG. 1, input AC signal 102 is fed through input signal current plus Bias DC current 104 into sampler 106. Sampler 106 has clock 108 and clock bar 110, which are opposite in phase. Input of sampler 106 has even sampler 112 that drives even branch 114 and odd sampler 116 that drives odd branch 118. Output of sampler 106 is driven by clock 108 and clock bar 110. DC bleed current 120 inputs into switched bleed current 122. Switched bleed current 122 has clock bar 110 and clock 124. Output of switched bleed current 122 is driven by clock bar 110 and clock 124.

Even branch 114 of sampler 106 is connected to even demultiplexer 126 and odd branch 118 of sampler 106 is connected to odd demultiplexer 128. Switched bleed current 122 is connected to even demultiplexer 126 and odd demultiplexer 128. As noted, output of sampler 106 and switched bleed current 122 depends on clock 108, clock bar 110, and clock 124. This causes even branch 114 to be connected to demultiplexer 126 at even times and odd branch 118 to be connected to demultiplexer 128 at odd or opposite times. After initialization, switch bleed current 122 is connected to demultiplexer 126 or demultiplexer 128 when output of sampler 106 is not connected. For example, with respect to FIG. 1, Input signal 102 would go to even branch 114 when CLK 108 is high (active) and to odd branch 118 when CLKB 110 is high (active). Switched bleed current 122 has a pair of switches with outputs in parallel with sampler steer DC "dummy bleed current" 140 in the opposite clock phase or in the opposite direction of sampler 106. In a particular example, even multiplexer 126 is connected to DC dummy current 122 when CLKB 110 is active and Dummy current 122 is connected to odd branch 128 and when CLK 124 is active.

In the example embodiment of FIG. 1, input current into even demultiplexer 126 and odd demultiplexer 128 have the same DC current on both the clock phases clock and clock bar, with the signal superimposed on one phase and a dummy bleed current on the other phase. In the embodiment of FIG. 1, the multiplexer has fast settling on both phases instead of only one, removing intersymbol interference and the need for resistive switches with different clocks.

When current pulses emerge from the time-interleaved outputs of even demultiplexer 126 or odd demultiplexer 128, where only one of the even/odd demultiplexers is active at once, the output has a DC content (for example, I) with a signal superimposed (for example, +/−I/2). To reduce or remove DC content of the signal, an opposite polarity DC bleed current (for example, −I) is steered through demultiplexer 134 or 144, depending on which demultiplexer has a signal, to the active output. Steering an opposite polarity DC bleed current reduces required signal swing and also helps settling requirements of circuits, to allow a lower supply voltage or lower overall power consumption or a combination of the two. An opposite polarity bleed current is realized using PMOS demultiplexing switches 134, 126 and current source from a supply. PMOS demultiplexer 134 has a set of switches 136 through 138. Similarly even demultiplexer 126 has a set of switches 130 to 132, when each respective switch 130-132 receives a signal from sampler 106, each respective switch 136-138 that corresponds to switch 130-132 is actively feeding an opposite polarity bleed current to the respective switch 130-132. PMOS demultiplexer 144 has a set of switches 146 through 148. Similarly, even demultiplexer 128 has a set of switches 140 to 142, when each respective switch 140-142 receives a signal from sampler 106, each respective switch 146-148 that corresponds to switch 140-142 is actively feeding an opposite polarity bleed current to the respective switch 140-142. As well, the respective PMOS demultiplexer actively feeds the respective active even or odd demultiplexer switch for one time period after sampler 106 input is active.

Refer now to the example embodiments of FIGS. 2A-2E and FIG. 3, which show illustrative switching or sampling of an input signal. Note, in the example embodiments of FIGS. 2A-2E the same label indicates the same element in each figure. Clock 208,224 and Clock bar 210 are in opposite phase and at each time (T0, T1, T2, T3, T4 . . . ).

Figure 2A:
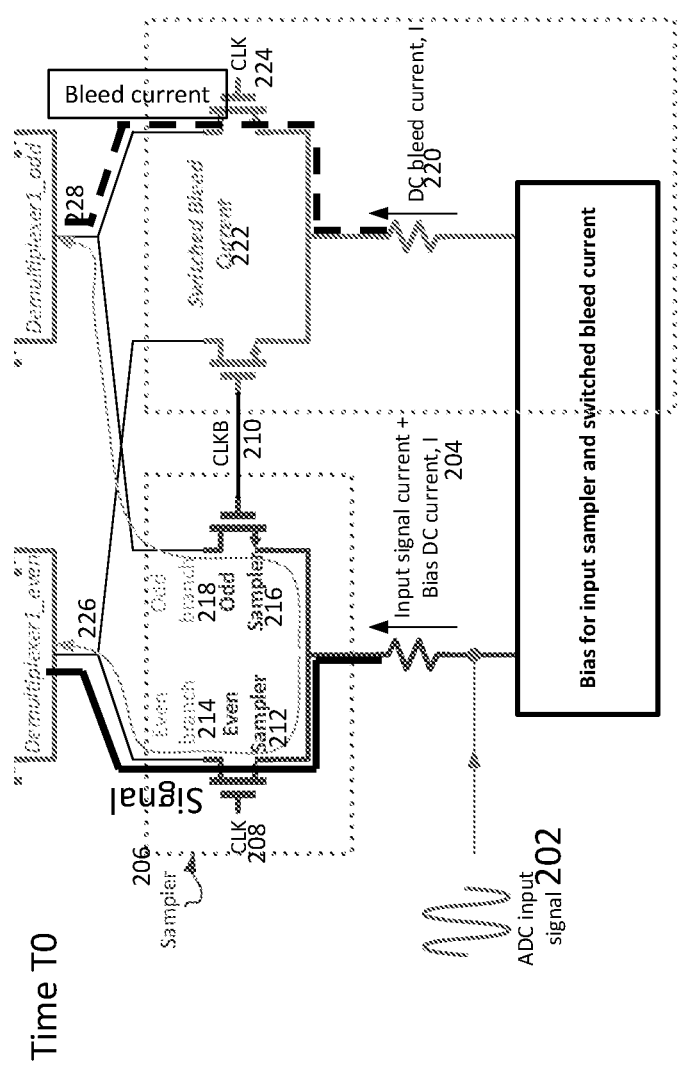
Figure 2B:
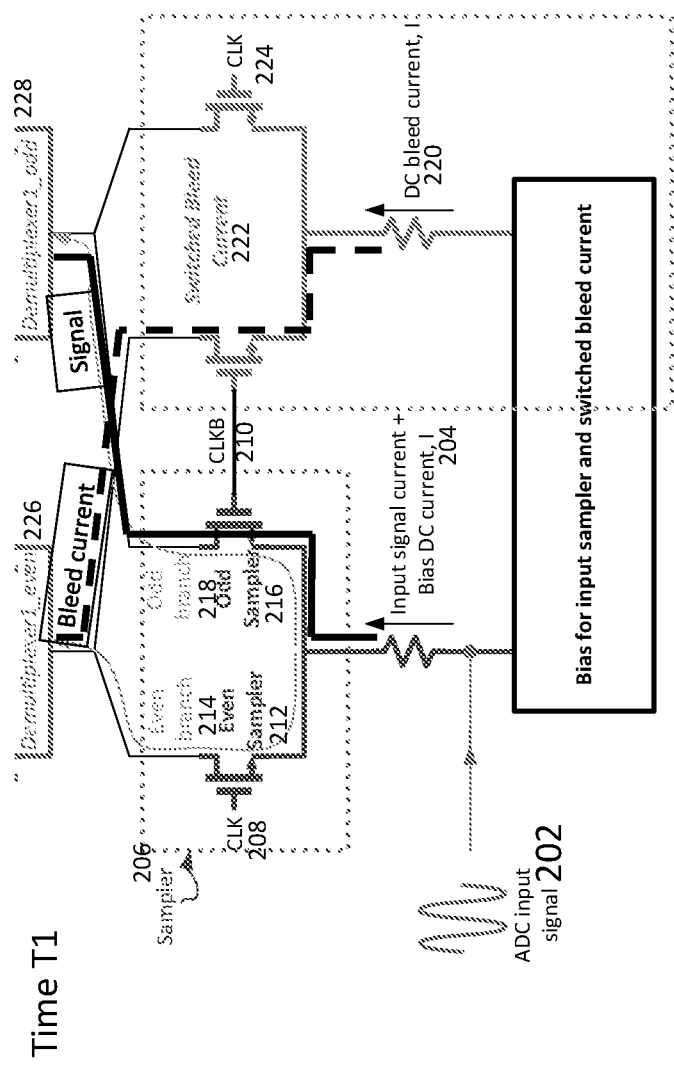

In FIG. 2A at time T0, signal 202 has passed as input current 204 into sampler 206 into even sampler 212. Clock 208 is active and signal passes on even branch 214 to demultiplexer 226 (step 305). As well in FIG. 2A at time T0, DC bleed current 220 has flowed into switched bleed current 222. As clock 224 is active, DC bleed current 220 is sent to demultiplexer 228 (step 310). In FIG. 2B at time T1, signal 202 has passed as input current 204 into sampler 206 into odd sampler path 216. Clock bar 210 is active and signal 202 continues on odd branch 218 to demultiplexer 228 (step 315). As well in FIG. 2B at time T1, DC bleed current 220 has flowed into switched bleed current 222. As clock bar 210 is active, DC bleed current 220 is sent to demultiplexer 226 (step 320).

In FIG. 2C at time T2, signal 202 has passed as input current 204 into sampler 206 into even sampler 212. Clock 208 is active and signal 202 passes on even branch 214 to demultiplexer 226 (step 305). As well in FIG. 2C at time T2, DC bleed current 220 has flowed into switched bleed current 222. As clock 224 is active, DC bleed current 220 is sent to demultiplexer 228 (step 310).

Figure 2D:
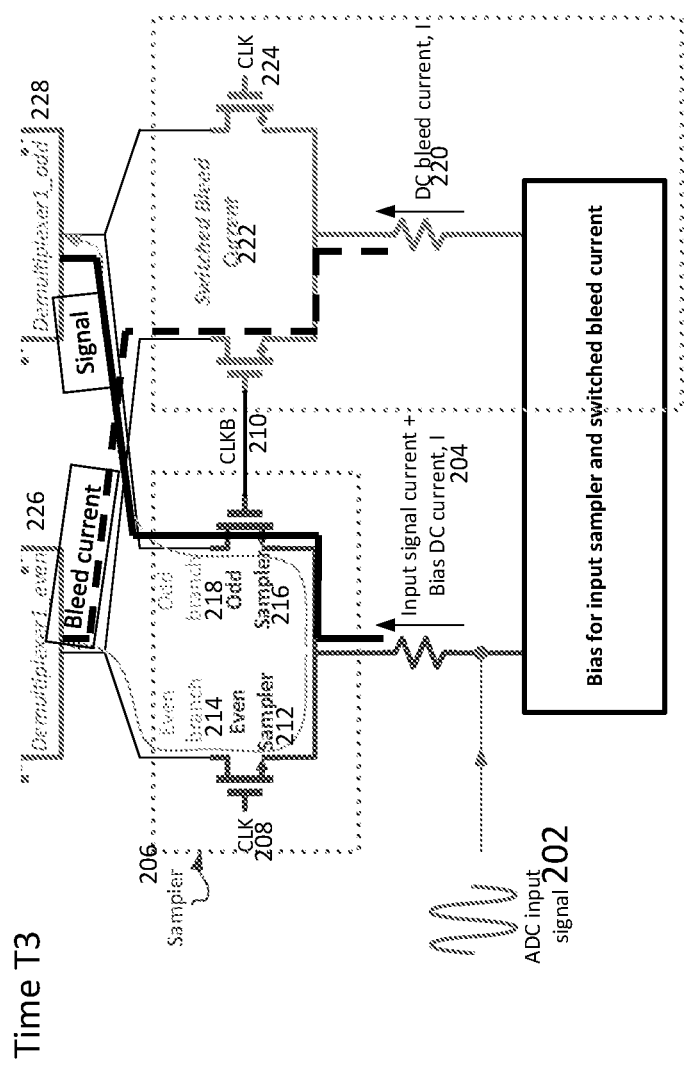

In FIG. 2D at time T3, signal 202 has passed as input current 204 into sampler 206 into odd sampler path 216. Clock bar 210 is active and signal 202 continues on odd branch 218 to demultiplexer 228 (step 315). As well in FIG. 2D at time T2, DC bleed current 220 has flowed into switched bleed current 222. As clock bar 210 is active, DC bleed current 220 is sent to demultiplexer 226 (step 320).

Figure 2E:
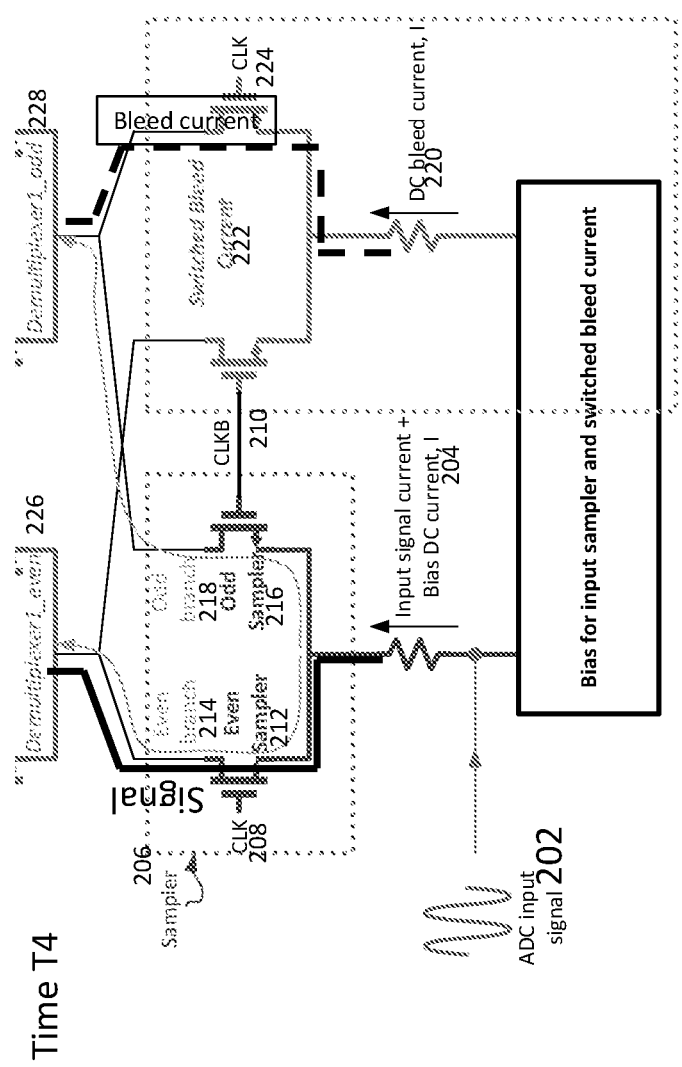
Figure 3:
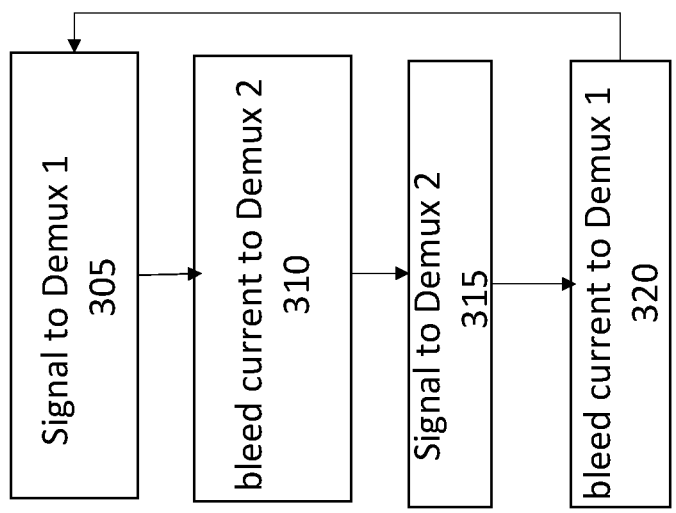
FIG. 3 is a simplified method of switching or sampling of an input signal, in accordance with an embodiment of the present disclosure.

In FIG. 2E at time T4, signal 202 has passed as input current 204 into sampler 206 into even sampler 212. Clock 208 is active and signal 202 passes on even branch 214 to demultiplexer 226 (step 315). As well in FIG. 2E at time T4, DC bleed current 220 has flowed into switched bleed current 222. As clock 224 is active, DC bleed current 220 is sent to demultiplexer 228 (step 320).

Figure 4A:
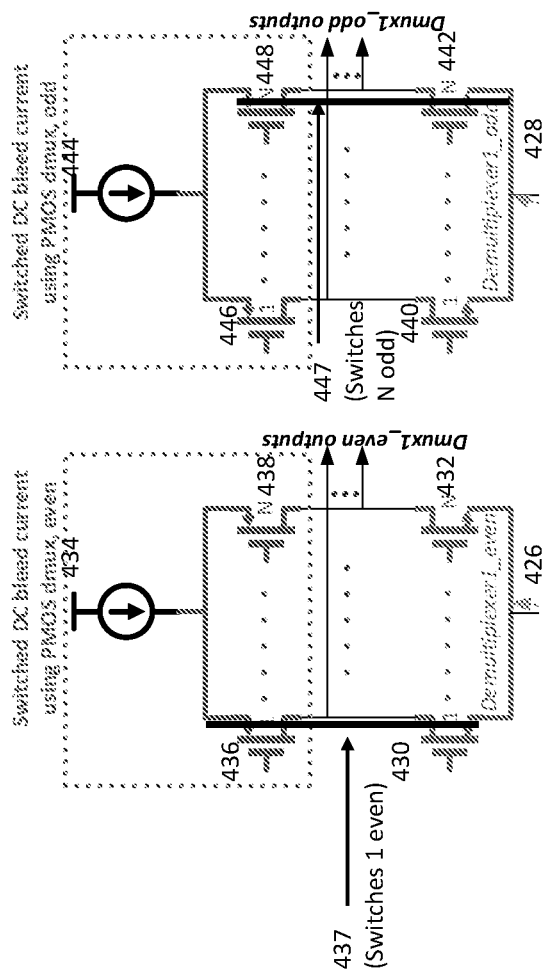
FIGS. 4A-4F are simplified illustrations of using a switched DC bleed current, in accordance with embodiments of the present disclosure.
Figure 4B:
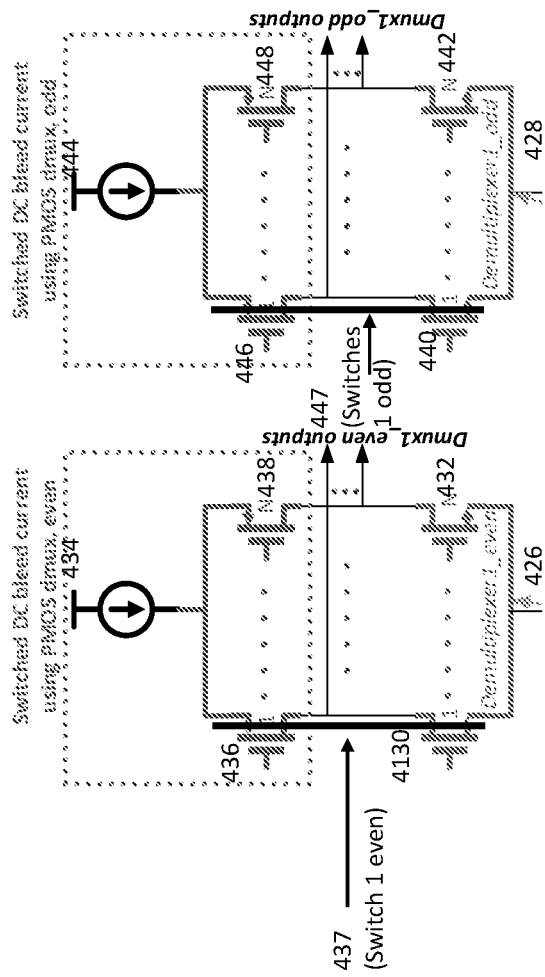
Figure 4C:
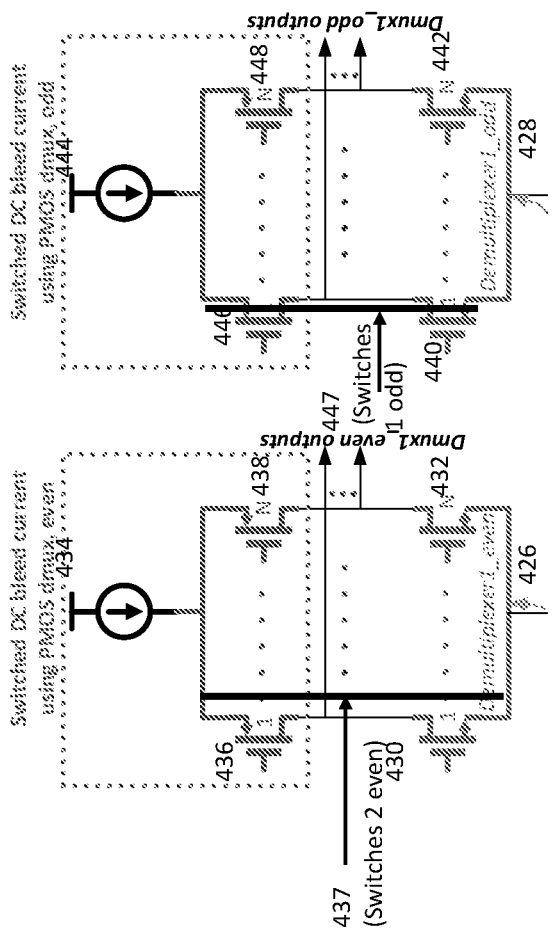
Figure 4D:
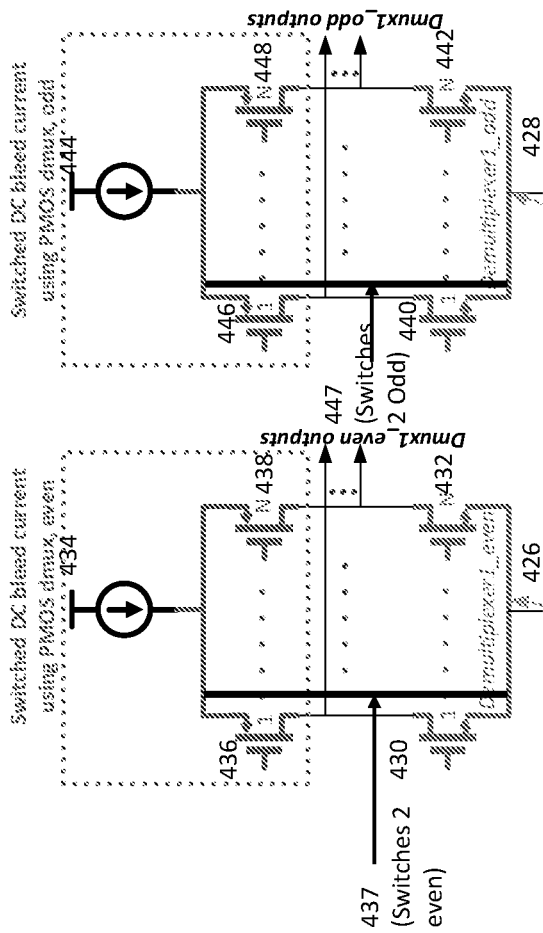
Figure 4E:
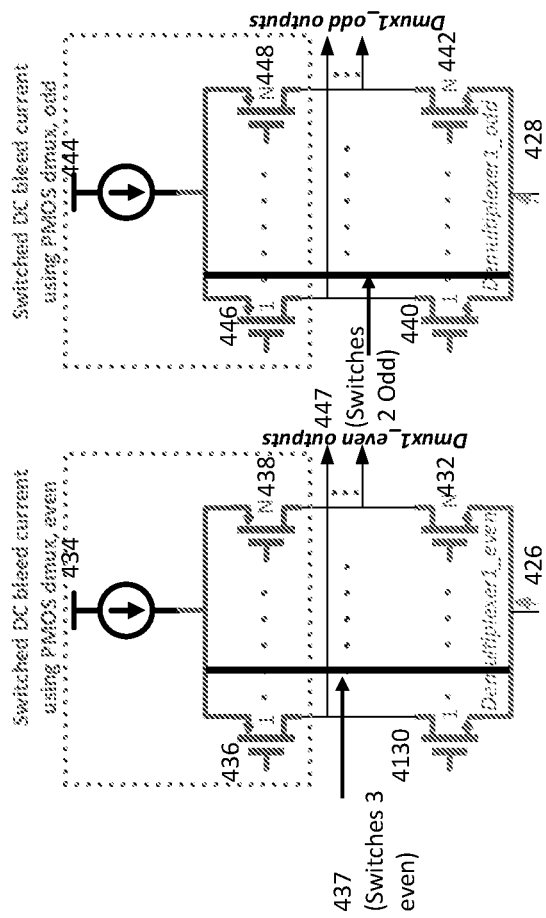
Figure 4F:
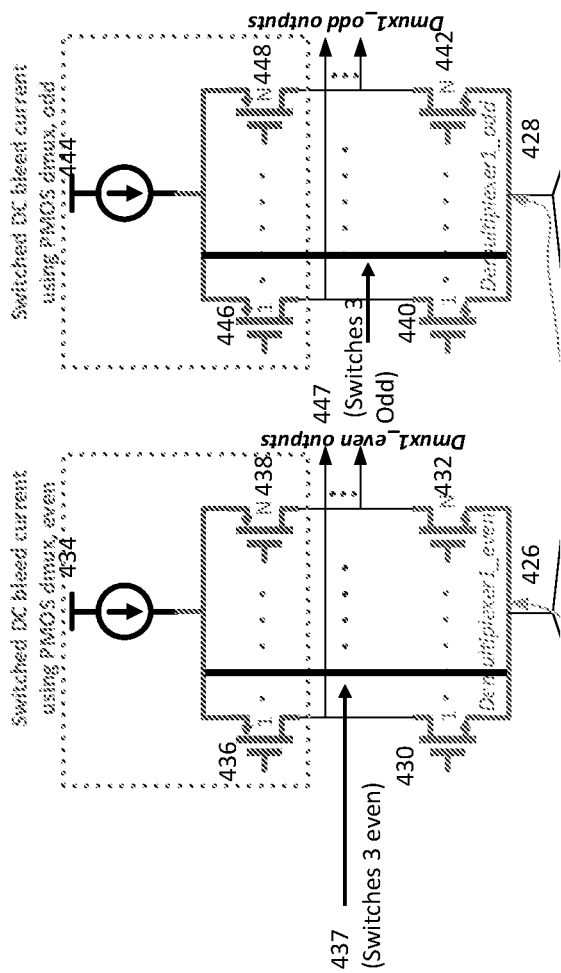
Figure 5B:
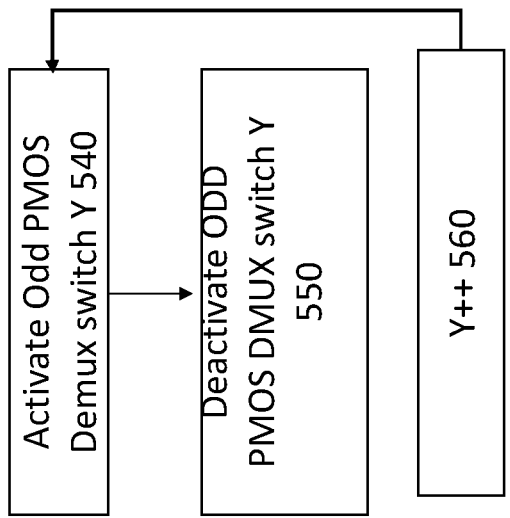
FIGS. 5A and 5B are simplified methods of illustration using a switched DC bleed current, in accordance with embodiments of the present disclosure.
Figure 5A:
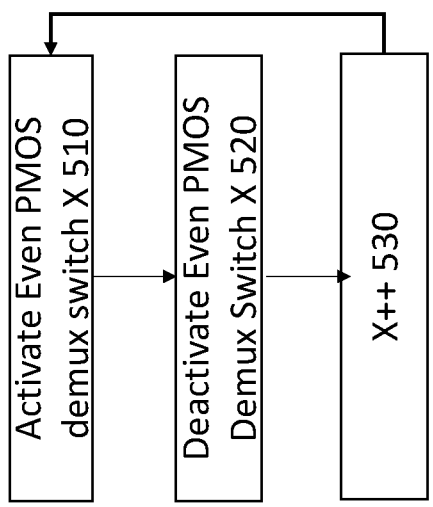

Refer now to the example embodiments of 4A-4F and FIGS. 5A and 5B. Note, in FIGS. 4A-4F, the same label number indicates the same component across the figures other than the active switches. In FIG. 4A, even demultiplexer 426 receives sampler input and switch 1 of 430 is active to output the inputted signal. Switched DC bleed current demultiplexer 434 has active switch 436 as shown by line 437 to steer an opposite polarity DC bleed current to the active output to reduce signal swing and help settling requirements of the circuit. Switched DC bleed current demultiplexer 444 has active switch N 448 as shown by line 447 to steer an opposite polarity DC bleed current to the active output to reduce signal swing and help settling requirements of the circuit. Demultiplexer 444 is at the end of its cycle, at switch N 448, and demultiplexer 434 is at the beginning of its cycle at switch 1 436.

In FIG. 4B, odd demultiplexer 428 receives sampler input and switch 440 is active to output the inputted signal. Switched DC bleed current demultiplexer 444 has active switch 1 of switches 446 as shown by line 44 7, one of which steers an opposite polarity DC bleed current to the active output to reduce signal swing and help settling requirements of the circuit. Even demultiplexer 426 receives sampler input and switch 1 of switches 440 is active to output the inputted signal. Switched DC bleed current demultiplexer 434 has active switch 436 as shown by line 437 to steer an opposite polarity DC bleed current to the output of the demultiplexer even 426 although it is receiving no active signal to help output to reduce signal swing and help settling requirements of the circuit.

In FIG. 4C, even demultiplexer 426 receives sampler input and switch 2 of switches 430 is active to output the inputted signal. Switched DC bleed current demultiplexer 434 has active switch 2 of switches 436 as shown by line 437 to steer an opposite polarity DC bleed current to the active output to reduce signal swing and help settling requirements of the circuit. Switched DC bleed current demultiplexer 444 has active switch 1 of switches 446 as shown by line 447 to steer an opposite polarity DC bleed current to the active output, although receiving no active signal, to reduce signal swing and help settling requirements of the circuit.

In FIG. 4D, odd demultiplexer 428 receives sampler input and switch 440 is active to output the inputted signal. Switched DC bleed current demultiplexer 444 has active switch 2 of switches 446 as shown by line 447 to steer an opposite polarity DC bleed current to the active output to reduce signal swing and help settling requirements of the circuit. Even demultiplexer 426 receives sampler input and switch 1 of switches 440 is active to output the inputted signal. Switched DC bleed current demultiplexer 434 has active switch 436 as shown by line 437 to steer an opposite polarity DC bleed current to the output of even demultiplexer 426 although it is receiving no active signal to help output to reduce signal swing and help settling requirements of the circuit.

In FIG. 4E, even demultiplexer 426 receives sampler input and switch 3 of switches 430 is active to output the inputted signal. Switched DC bleed current demultiplexer 434 has active switch 3 of switches 436 as shown by line 437 to steer an opposite polarity DC bleed current to the active output to reduce signal swing and help settling requirements of the circuit. Switched DC bleed current demultiplexer 444 has active switch 2 of switches 446 as shown by line 447 to steer an opposite polarity DC bleed current to the active output, although receiving no active signal, to reduce signal swing and help settling requirements of the circuit.

In FIG. 4F, odd demultiplexer 428 receives sampler input and switch 440 is active to output the inputted signal. Switched DC bleed current demultiplexer 444 has active switch 3 of switches 446 as shown by line 447 to steer an opposite polarity DC bleed current to the active output to reduce signal swing and help settling requirements of the circuit. Even demultiplexer 426 receives sampler input and switch 3 of switches 440 is active to output the inputted signal. Switched DC bleed current demultiplexer 434 has active switch 436 as shown by line 437 to steer an opposite polarity DC bleed current to the output of the demultiplexer even 426 although it is receiving no active signal to help output to reduce signal swing and help settling requirements of the circuit.

FIGS. 5A and 5B illustrate sample methods for cycling through switches providing opposite polarity DC bleed currents. In FIG. 5A, activate even PMOS demultiplexer switch X (step 510). After a period of time, deactivate even PMOS demultiplexer switch X (step 520). Increment X and repeat for the number of switches (step 530). In FIG. 5B, activate odd PMOS demultiplexer switch Y (step 540). After a period of time, deactivate odd PMOS demultiplexer switch Y (step 550). Increment Y and repeat for the number of switches (step 560).

Figure 6A:
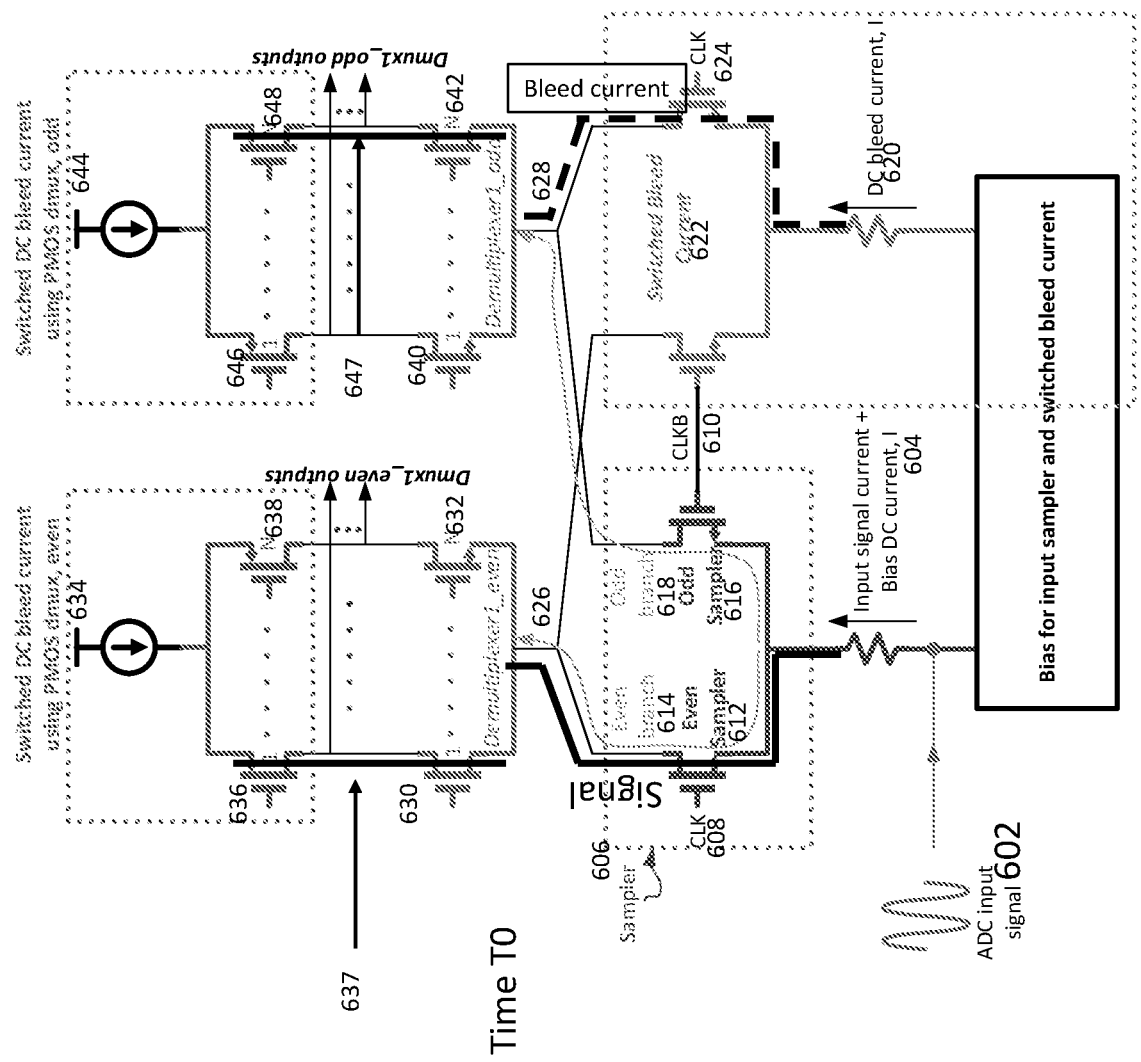
FIGS. 6A-6C are simplified illustrations using switched bleed currents of, in accordance with embodiments of the present disclosure.
Figure 6B:
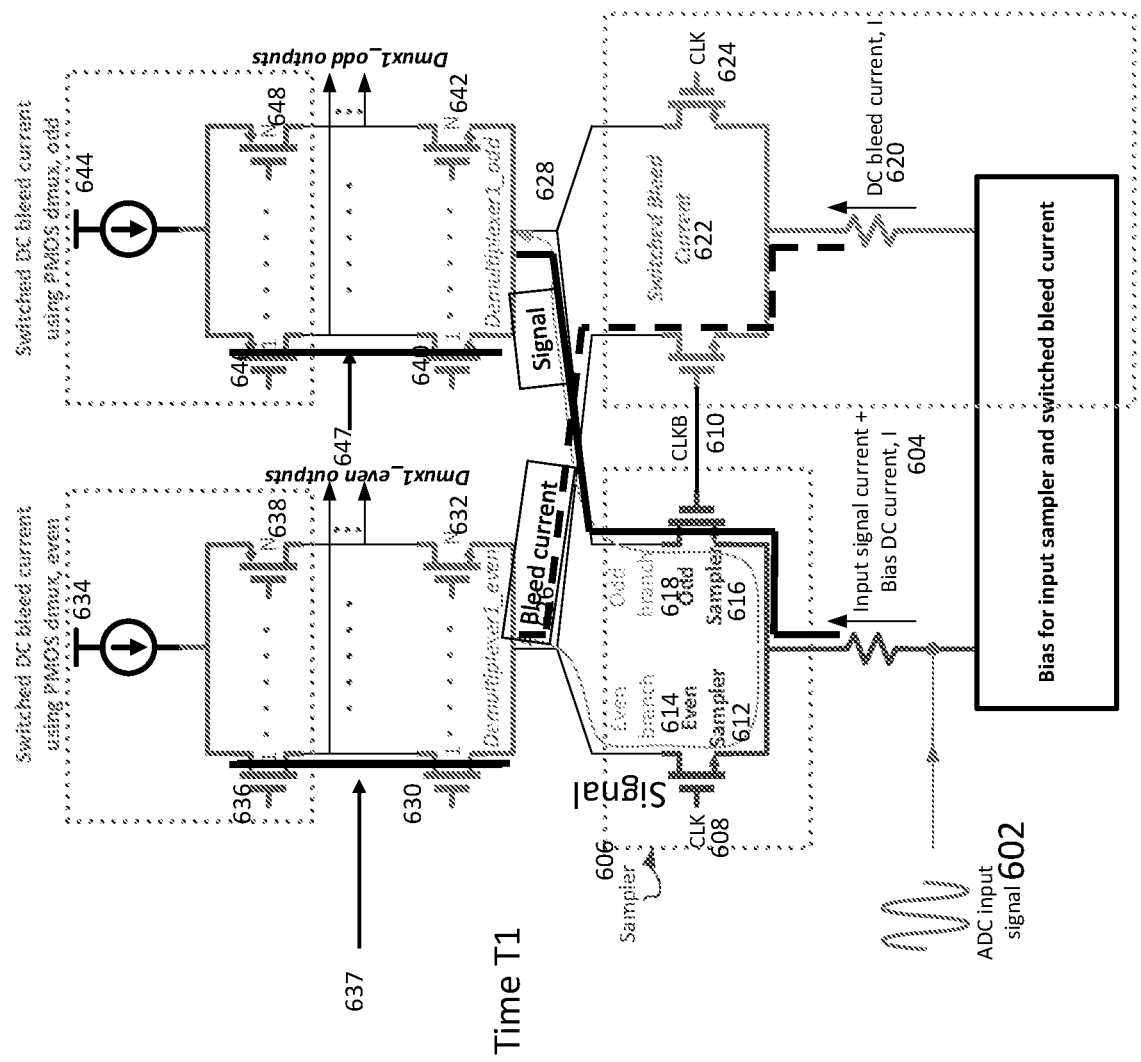
Figure 6C:
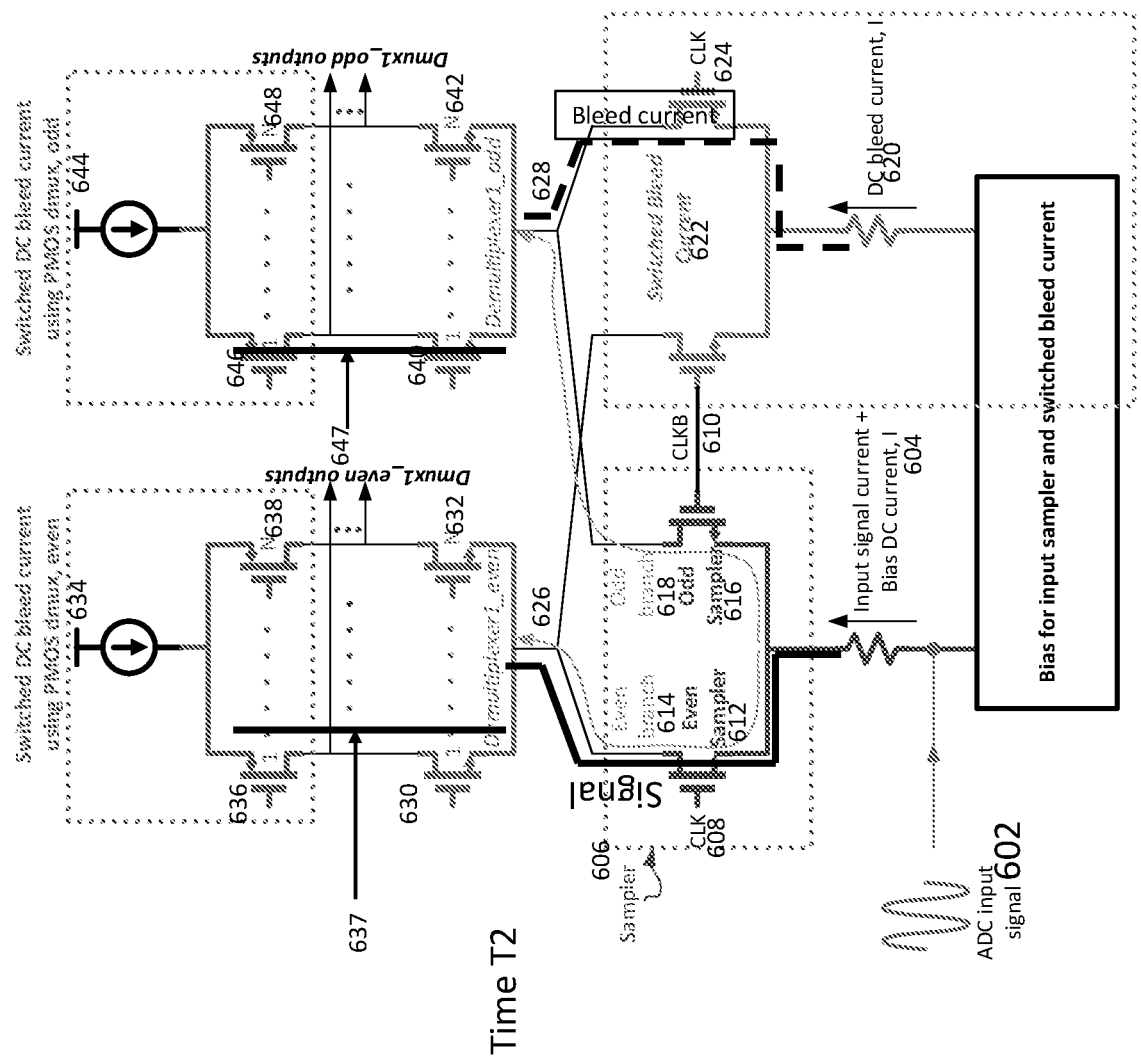

Refer now to the example embodiments of FIGS. 6A-6C and FIG. 3, which illustrate an input sample with switched bleed current and demultiplexer output with switched DC bleed current. In FIGS. 6A-6C, the same label indicates the same item and Clock 608, 624 and Clock bar 610 are in opposite phase and at each time (TO, TI, T2, T3, T4 . . . ).

In FIG. 6A at time TO, signal 602 has passed as input current 604 into sampler 606 into even sampler 612. Clock 608 is active and signal 602 passes on even branch 614 to demultiplexer 626 (step 305). As clock 624 is active, DC bleed current 620 is sent to demultiplexer 628 (step 310). Even demultiplexer 626 receives sampler input and switch 1 of 630 is active to output the inputted signal. Switched DC bleed current demultiplexer 634 has active switch 1 of switches 636 as shown by line 637 to steer an opposite polarity DC bleed current to the active output to reduce signal swing and help settling requirements of the circuit. Switched DC bleed current demultiplexer 644 has active switch N 648 as shown by line 647 to steer an opposite polarity DC bleed current to the active output to reduce signal swing and help settling requirements of the circuit. Demultiplexer 644 is at the end of its cycle, at switch N 648, and demultiplexer 634 is at the beginning of its cycle at switch 1 636.

In FIG. 6B at time TI, signal 602 has passed as input current 604 into sampler 606 into odd sampler path 616. Clock bar 610 is active and signal 604 continues on odd branch 618 to demultiplexer 628 (step 310). As well in FIG. 6B at time TI, DC bleed current 620 has flowed into switched bleed current 622. As clock bar 610 is active, DC bleed current 620 is sent to demultiplexer 626 (step 315). Odd demultiplexer 628 receives sampler input and switch 1 of switches 640 is active to output the inputted signal. Switched DC bleed current demultiplexer 644 has active switch 1 of switches 646 as shown by line 647 to steer an opposite polarity DC bleed current to the active output to reduce signal swing and help settling requirements of the circuit. Even demultiplexer 626 receives sampler input and switch 1 of switches 640 is active to output the inputted signal. Switched DC bleed current demultiplexer 634 has active switch 636 as shown by line 637 to steer an opposite polarity DC bleed current to the output of the even demultiplexer 626 although it is receiving no active signal to help output to reduce signal swing and help settling requirements of the circuit.

In FIG. 6C at time T2, signal 602 has passed as input current 604 into sampler 606 into even sampler 612. Clock 608 is active and signal passes on even branch 614 to demultiplexer 626 (step 305). As well in FIG. 6C at time T2, DC bleed current 620 has flowed into switched bleed current 622. As clock bar 610 is active, DC bleed current 620 is sent to demultiplexer 628 (step 310). Even demultiplexer 626 receives sampler input and switch 2 of switches 630 is active to output the inputted signal. Switched DC bleed current demultiplexer 634 has active switch 2 of switches 636 as shown by line 637 to steer an opposite polarity DC bleed current to the active output to reduce signal swing and help settling requirements of the circuit. Switched DC bleed current demultiplexer 644 has active switch 1 of switches 646 as shown by line 647 to steer an opposite polarity DC bleed current to the active output, although receiving no active signal, to reduce signal swing and help settling requirements of the circuit.

In some embodiments, one or more of the techniques described herein may be stored on a computer readable medium. In certain embodiments, a computer readable medium may be one or more memories, one or more hard drives, one or more flash drives, one or more compact disk drives, or any other type of computer readable medium. In certain embodiments, one or more of the embodiments described herein may be embodied in a computer program product that may enable a processor to execute the embodiments. In many embodiments, one or more of the embodiments described herein may be executed on at least a portion of a processor.

In most embodiments, a processor may be a physical or virtual processor. In other embodiments, a virtual processor may be spread across one or more portions of one or more physical processors. In certain embodiments, one or more of the techniques or embodiments described herein may be embodied in hardware such as a Digital Signal Processor DSP. In certain embodiments, one or more of the embodiments herein may be executed on a DSP. One or more of the techniques herein may be programed into a DSP. One or more of the techniques herein may be fabricated in a DSP. In some embodiments, a DSP may have one or more processors and one or more memories. In certain embodiments, a DSP may have one or more computer readable storages. In other embodiments, one or more of the embodiments stored on a computer readable medium may be loaded into a processor and executed.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within +20% of a target value in some embodiments, within +10% of a target value in some embodiments, within +5% of a target value in some embodiments, and yet within +2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

The terms "approximately" and "about" may be used to mean within ±20% of a target value in some embodiments, within ±10% of a target value in some embodiments, within ±5% of a target value in some embodiments, or within ±2% of a target value in some embodiments. The terms "approximately" and "about" may include the target value.

What is claimed is:

1. A circuit, comprising:
   a sampler to receive an input signal and direct the input signal to a first path at a first set of times and to a second path at a second set of times; and
   a switched bleed current circuit to receive a bleed current and direct the bleed current to the first path at the second set of times and to the second path at the first set of times.

2. The circuit of claim 1, wherein the circuit further comprises:
   a first clock coupled to the sampler;
   a second clock coupled to the switched bleed current circuit; and
   a clockbar coupled to the sampler and the switched bleed current circuit,
   wherein, based on the first clock and the second clock being active at the first set of times, the switched bleed current circuit directs the input signal to the first path and directs the bleed current to the second path; and
   wherein, based on the clockbar being active at the second set of times, the switched bleed current circuit directs the input signal to the second path and directs the bleed current to the first path.

3. The circuit of claim 2, wherein at least one of the first clock, the second clock, or the clockbar is implemented based on a p-type device.

4. The circuit of claim 2, wherein at least one of the first clock, the second clock, or the clockbar is implemented based on an n-type device.

5. The circuit of claim 1, wherein the first path is coupled to a first demultiplexer, and wherein the second path is coupled to a second demultiplexer.

6. The circuit of claim 1, wherein the input signal comprises an input signal current and a bias direct current.

7. The circuit of claim 1, comprising a high-speed, low-power analog-to-digital converter comprising the sampler.

8. A system, comprising:
   a circuit, comprising:
   a sampler to receive an input signal and direct the input signal to a first path at a first set of times and to a second path at a second set of times;
   switched bleed current circuit to receive a bleed current and direct the bleed current to the first path at the second set of times and to the second path at the first set of times;
   a first demultiplexer coupled to the first path to output the input signal at the first set of times and the bleed current at the second set of times; and
   a second demultiplexer coupled to the second path to output the bleed current at the first set of times and the input signal at the second set of times.

9. The system of claim 8, wherein the circuit further comprises:
   a first clock coupled to the sampler;
   a second clock coupled to the switched bleed current circuit; and
   a clockbar coupled to the sampler and the switched bleed current circuit,
   wherein, based on the first clock and the second clock being active at the first set of times, the switched bleed current circuit directs the input signal to the first path and directs the bleed current to the second path; and
   wherein, based on the clockbar being active at the second set of times, the switched bleed current circuit directs the input signal to the second path and directs the bleed current to the first path.

10. The system of claim 9, wherein at least one of the first clock, the second clock, or the clockbar is implemented based on a p-type device.

11. The system of claim 9, wherein at least one of the first clock, the second clock, or the clockbar is implemented based on an n-type device.

12. The system of claim 8, wherein the circuit further comprises:
    a first switched bleed current demultiplexer to direct a first opposite polarity bleed current to an output of the first demultiplexer; and a second switched bleed current demultiplexer to direct a second opposite polarity bleed current to an output of the second demultiplexer,
    wherein the first opposite polarity bleed current and the second opposite polarity bleed current reduce signal swing and satisfy settling requirements of the circuit.

13. The system of claim 8, wherein the input signal comprises an input signal current and a bias direct current.

14. The system of claim 8, comprising a high-speed, low-power analog-to-digital converter comprising the sampler.

15. A method, comprising:
providing an input signal to a sampler;
providing a bleed current to a switched bleed current device;
directing, by the sampler, the input signal to a first path at a first set of times and to a second path at a second set of times; and directing, by the switched bleed current device, the bleed current to the first path at the second set of times and to the second path at the first set of times.

16. The method of claim 15, wherein directing the input signal to the first path and the bleed current to the second path is based on a first clock coupled to the sampler and a second clock coupled to the switched bleed current device being active at the first set of times, and wherein directing the input signal to the second path and the bleed current to the first path is based on a clockbar coupled to the sampler and the switched bleed current device being active at the second set of times.

17. The method of claim 16, wherein at least one of the first clock, the second clock, or the clockbar is implemented using a p-type device.

18. The method of claim 16, wherein at least one of the first clock, the second clock, or the clockbar is implemented using an n-type device.

19. The method of claim 15, further comprising:
providing the first path to a first demultiplexer;
and providing the second path to a second demultiplexer.

20. The method of claim 15, wherein the input signal comprises an input signal current and a bias direct current.

\* \* \* \* \*